United States Patent
Zhak et al.

(10) Patent No.: US 7,095,256 B1
(45) Date of Patent: Aug. 22, 2006

(54) LOW-POWER WIDE DYNAMIC RANGE ENVELOPE DETECTOR SYSTEM AND METHOD

(75) Inventors: Serhii M. Zhak, Cambridge, MA (US); Michael W. Baker, Cambridge, MA (US); Rahul Sarpeshkar, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/892,669

(22) Filed: Jul. 16, 2004

Related U.S. Application Data

(60) Provisional application No. 60/488,147, filed on Jul. 17, 2003.

(51) Int. Cl.
*G01R 19/00* (2006.01)
(52) U.S. Cl. .............................. 327/58; 327/59; 327/18
(58) Field of Classification Search ...................... None
See application file for complete search history.

(56) References Cited

U.S. PATENT DOCUMENTS

| | | | | |
|---|---|---|---|---|
| 4,318,050 A | | 3/1982 | Okanobu | 329/364 |
| 4,445,054 A | | 4/1984 | Ishii | 327/104 |
| 5,465,072 A | * | 11/1995 | Atarodi | 330/254 |
| 5,530,399 A | * | 6/1996 | Chambers et al. | 327/561 |
| 6,169,433 B1 | * | 1/2001 | Farrenkopf | 327/131 |
| 6,552,611 B1 | * | 4/2003 | Yamamoto | 330/253 |
| 6,683,497 B1 | * | 1/2004 | Kimura | 330/253 |
| 6,867,649 B1 | * | 3/2005 | Lehto | 330/252 |

FOREIGN PATENT DOCUMENTS

| | | |
|---|---|---|
| JP | 61231464 | 10/1986 |
| JP | 06303037 | 10/1994 |

* cited by examiner

*Primary Examiner*—Timothy P. Callahan
*Assistant Examiner*—Hiep Nguyen
(74) *Attorney, Agent, or Firm*—Gauthier & Connors LLP

(57) ABSTRACT

An envelope detector system is disclosed for detecting an envelope in a system input signal. The envelope detector system includes an input node for receiving an input voltage signal, a transconducting amplifier for receiving the input voltage signal and producing an input current signal, a current mirror network for receiving the input current signal and for producing a current output signal, a capacitor for receiving the current output signal, and a rectifier output node for providing a rectifier output current signal. The capacitor is coupled to an input of the transconducting amplifier. The rectifier output current signal is fed into the current-mode wide-dynamic-range peak detector. The peak detector produces the envelope detector output current signal.

29 Claims, 12 Drawing Sheets

LOW-POWER WIDE DYNAMIC RANGE ENVELOPE DETECTOR SYSTEM AND METHOD

This application claims priority to U.S. Provisional Application Ser. No. 60/488,147 filed Jul. 17, 2003.

BACKGROUND OF THE INVENTION

The invention generally relates to systems in which signal amplitude sensing and/or waveform envelope extraction is needed.

Cochlear implants (or bionic ears) have been implanted in tens of thousands of people worldwide. Cochlear implants typically mimic the function of the ear by stimulating neurons in the cochlea in response to sound. FIG. I shows an overview of a common signal-processing chain that may be used in a cochlear implant. Only four channels of processing are shown although cochlear implants typically have 16 channels. Sound is first sensed by a microphone 10. Pre-emphasis filtering and automatic gain control (AGC) are then performed on the input at pre-emphasis filtering and AGC unit 12. Analog implementations of the AGC require envelope detection to be performed. Bandpass filters 14, 16, 18, 20 divide the AGC output into different frequency bands. Envelope Detectors 22, 24, 26, 28 then detect the envelope of the waveform in each channel. The dynamic range of each channel's envelope output is then compressed at compression units 30, 32, 34, 36 to fit into the electrode dynamic range via the nonlinear compression blocks. Finally, the signals from each channel are modulated at modulation units 38, 40, 42 44 by the compressed envelope information and sent to the electrodes to create charge-balanced current stimulation. Conventional cochlear implant systems typically employ a digital signal processor (DSP)—based system that may be worn as a pack on the belt or as a unit to be worn behind the ear.

There is a need, however, for a system and method that may be fully implanted. Reducing the power required for a cochlear implant would facilitate the development of a fully implanted system.

SUMMARY

The invention provides an envelope detector system for detecting an envelope in a system input signal. The envelope detector system in accordance with an embodiment of the invention includes an input node for receiving an input voltage signal, a transconducting amplifier for receiving the input voltage signal and for producing an input current signal, a current mirror network for receiving the input current signal and for producing a current output signal, a capacitor for receiving the current output signal. The capacitor is coupled to an input of the transconducting amplifier. The current mirror network may include a simple 5-transistor transconducting amplifier. The invention also provides a rectifier system that includes a rectifier output node for providing a current rectifier signal, and a peak detector circuit including class A first-order log-domain low-pass filter (LPF), and a feedback loop with a non-linear one-directional circuit including transistor source follower loaded with a capacitor for setting a release time constant. The peak detector circuit also includes a peak detector output node for providing an envelope detector output signal in accordance with an embodiment of the invention.

An envelope detector system in accordance with another embodiment of the invention includes an input node for receiving an input voltage signal, a transconducting amplifier for receiving the input voltage signal and for producing an input current signal, a current mirror network for receiving the input current signal and for producing a current output signal, a capacitor for receiving the current output signal. The capacitor is coupled to an input of the transconducting amplifier. The current mirror network includes an active feedback amplifier implemented as a transconducting amplifier with a floating battery. The system also includes a rectifier output node for providing a current rectifier signal, and a peak detector circuit including class A first-order log-domain low-pass filter (LPF), and a feedback loop with a non-linear one-directional circuit including transistor source follower loaded with a capacitor for setting a release time constant. The peak detector circuit also includes a peak detector output node for providing an envelope detector output signal in accordance with an embodiment of the invention.

In accordance with a further embodiment, the invention provides a peak detector system that includes an input node for receiving an input current rectified signal, and a peak detector circuit including class A first-order log-domain low-pass filter (LPF), and a feedback loop with a non-linear one-directional circuit including transistor source follower loaded with a capacitor for setting a release time constant. The peak detector system also includes a peak detector output node for providing an envelope detector output signal in accordance with an embodiment of the invention.

BRIEF DESCRIPTION OF THE DRAWING

The following description may be further understood with reference to the accompanying drawings in which.

Figure 10:
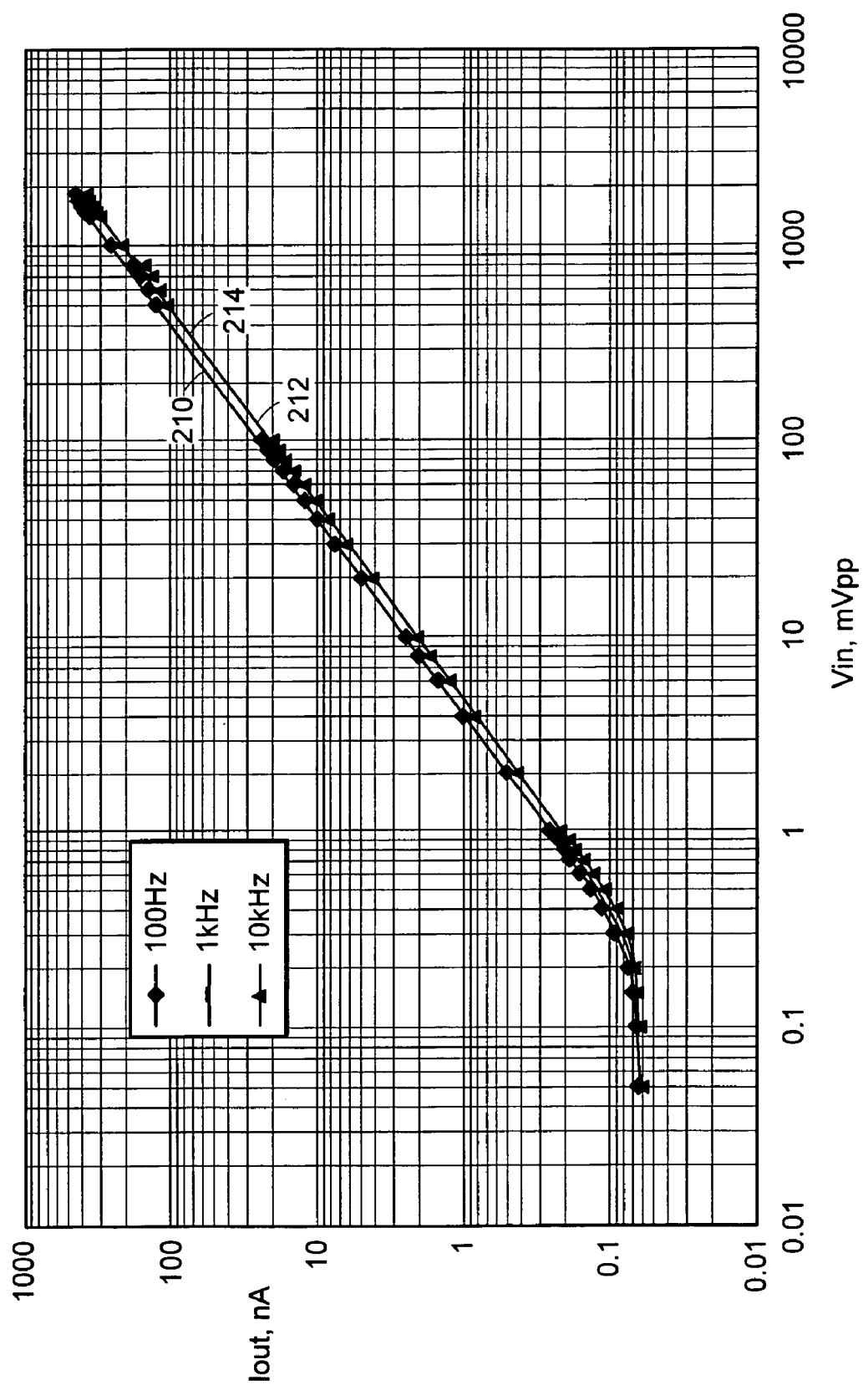
Figure 11:
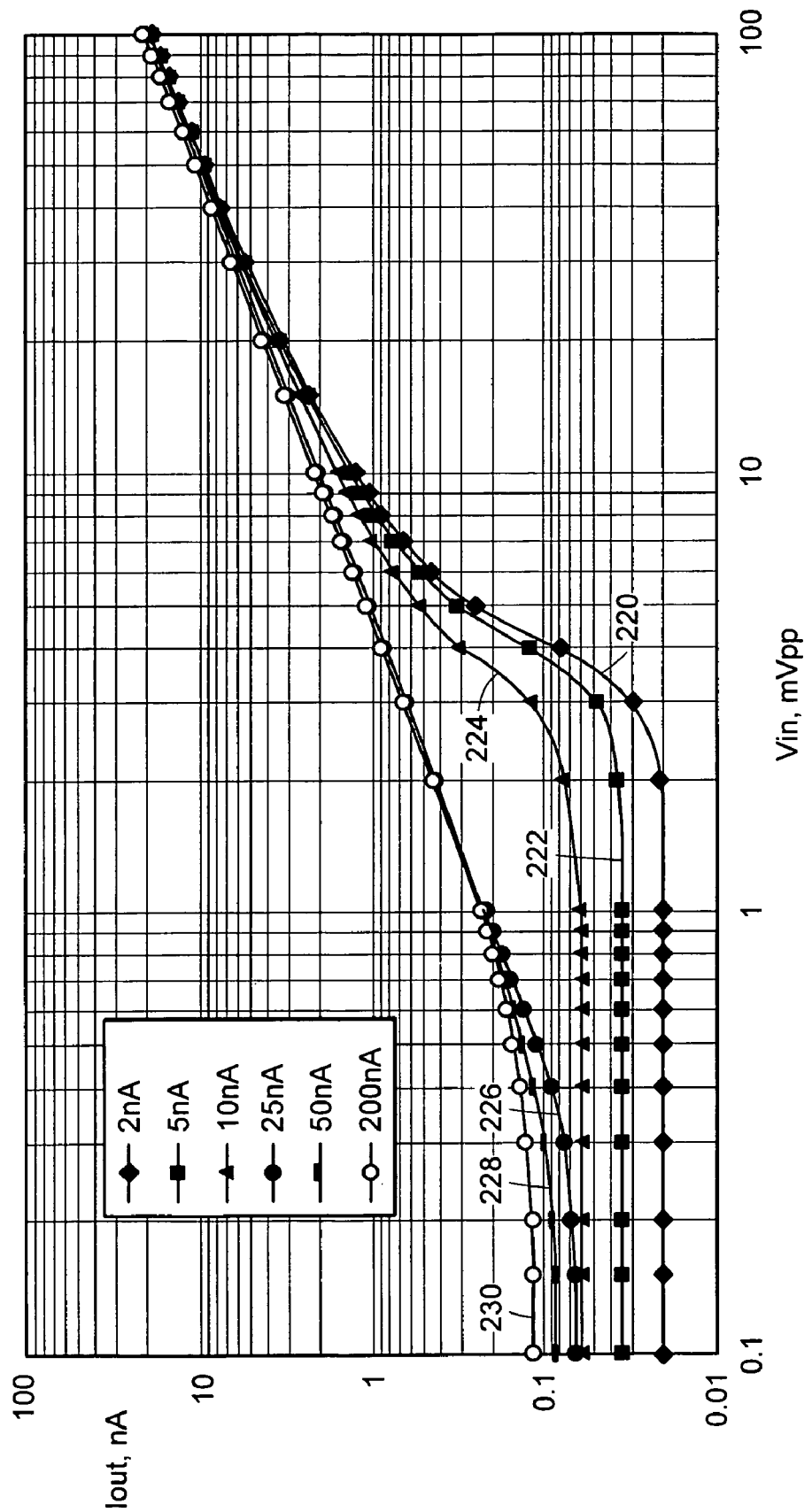

FIG. 10 shows an illustrative diagrammatic graphical representation of experimentally measured envelope detector characteristics for a system in accordance with an embodiment of the invention for frequencies of 100 Hz, 1 kHz and 10 kHz;

FIG. 11 shows an illustrative diagrammatic graphical representation of experimental envelope detector characteristics for a system in accordance with an embodiment of the invention for a frequency of 10 kHz; and various bias currents of the dead-zone reduction circuit, i.e. various dead-zone widths.

Figure 12:
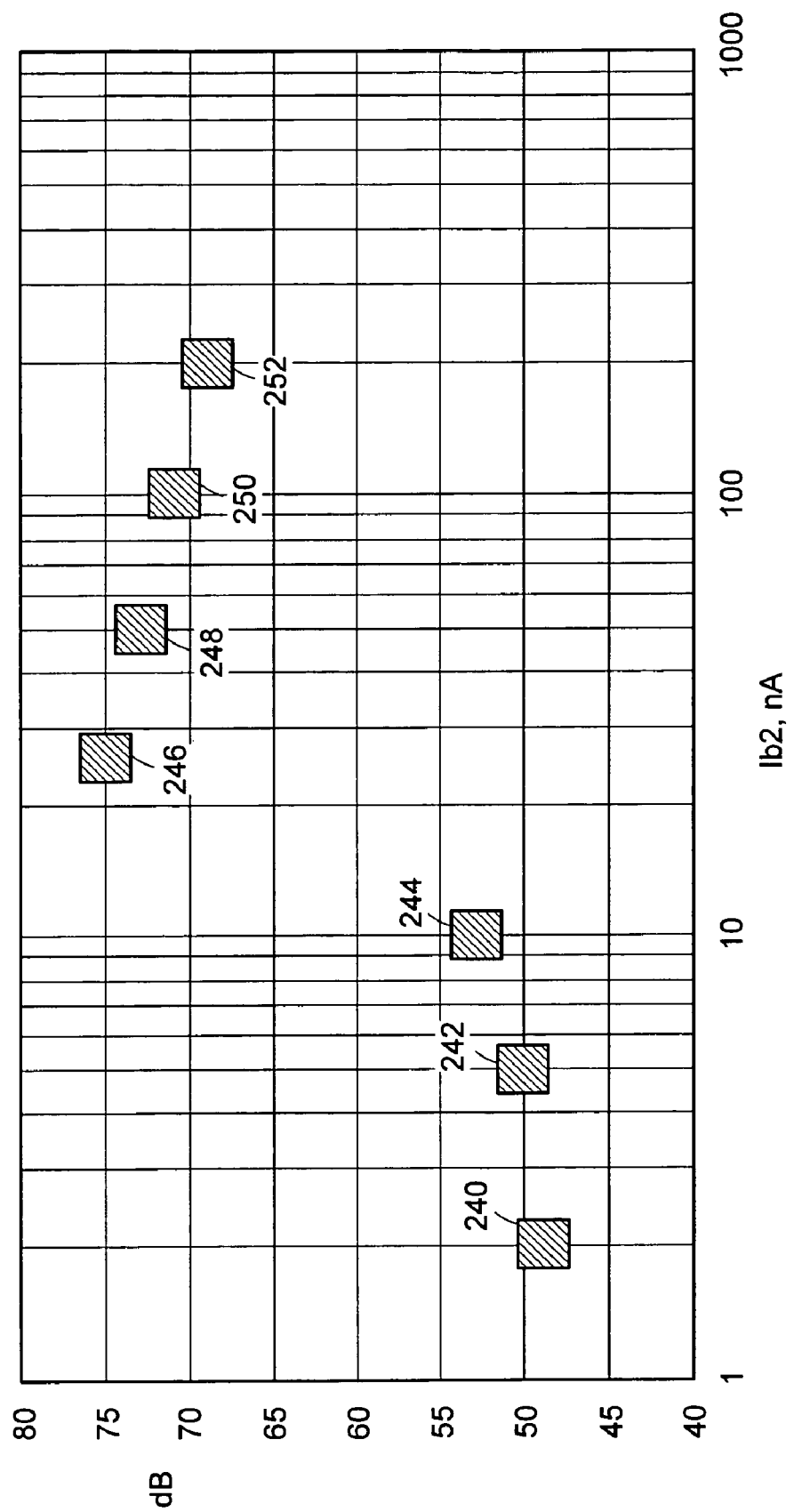

FIG. 12 shows an illustrative diagrammatic graphical representation of overall dynamic range for a system for various bias currents of the dead-zone reduction circuit, i.e. various dead-zone widths, in accordance with an embodiment of the invention.

The drawings are shown for illustrative purposes.

DETAILED DESCRIPTION OF THE ILLUSTRATED EMBODIMENTS

Applicants have discovered that reducing the power consumption of the envelope detector in a signal processing circuit for a cochlear implant may provide significant improvements in the power requirements of cochlear implants. Applicants have further discovered that all-analog processing strategies may be employed to provide envelope detectors with microwatt and sub-microwatt power consumption that may serve as important elements in ultra-low power all-analog signal processing circuits for cochlear implants.

Envelope detection is required for gain control and spectral energy estimation. Hearing aids perform broadband and multi-band compression and require envelope detection for gain control and spectral energy estimation as well. The input to an envelope detector in a system in accordance with an embodiment of the invention is a voltage but the output of the envelope detector may be a current. Translinear circuits may be used to implement a wide range of nonlinear functions on the output currents, which is useful for compression. Thus, the envelope detectors discussed below may be applicable to audio applications such as implant speech processing, speech recognition and hearing aids. If one is willing to increase power consumption, extensions to higher frequency applications such as sonar or RF demodulation are also possible.

A cochlear implant is typically battery powered and required to run off a low voltage. The cochlear implant application, therefore, offers a number of constraints on the design of envelope detectors. The envelope detector should provide frequency-independent operation over most of the audio range, from 100 Hz to 10 kHz. It should have a dynamic range of at least 60 dB for narrowband envelope detection, and 70 dB for broadband envelope detection. It should be insensitive to the input DC voltage providing a DC-offset-free current output. The envelope detector should have an adjustable attack time constant of around 10 ms, and an adjustable release time constant of around 100 ms. It should also minimize power while achieving all these specifications.

In accordance with an embodiment, the invention provides for a 75 dB, 2.8 µW, 100 Hz-10 kHz envelope detector in a 1.5 µm 2.8 V CMOS technology. The envelope detector performs input-dc-insensitive voltage-to-current-converting rectification followed by nanopower current-mode peak detection. The use of a sub-threshold wide-linear-range transconductor allows greater than 1.7 Vpp input voltage swings. This optimal performance is technology-independent for the given topology and may be improved only by using more power. A circuit topology is used to perform 140 nW peak detection with controllable attack and release time constants. The lower limits of envelope detection are determined by the more dominant of two effects: The first effect is caused by the inability of amplified high-frequency signals to exceed the dead-zone created by exponential non-linearities in the rectifier. The second effect is due to an output current caused by thermal noise rectification. The envelope detector is useful in low power cochlear implants for the deaf, hearing aids, and speech-recognition front ends. Extension of the envelope detector to higher-frequency applications may be achieved with increased power consumption.

Figure 1:
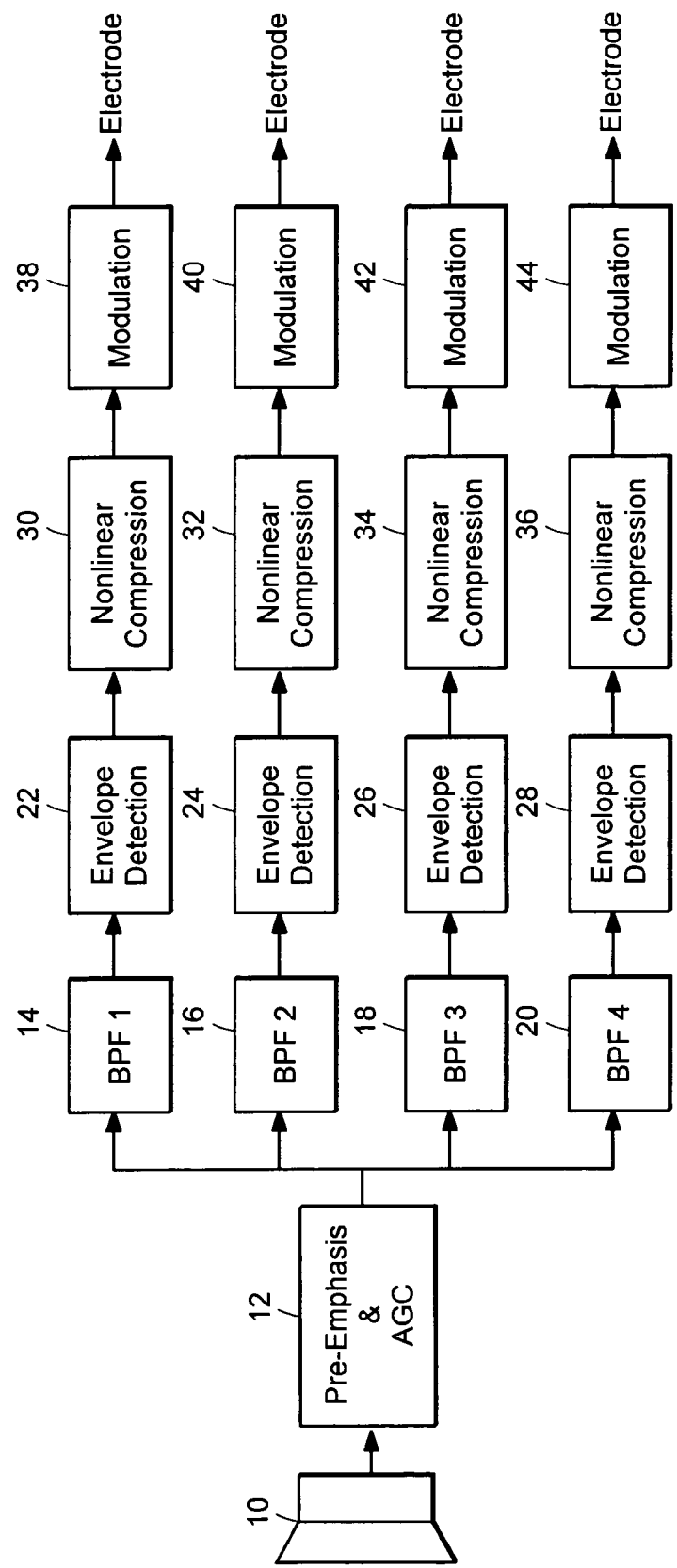
FIG. 1 shows an illustrative diagrammatic schematic view of a spectral enhancement system of the prior art.
Figure 2:
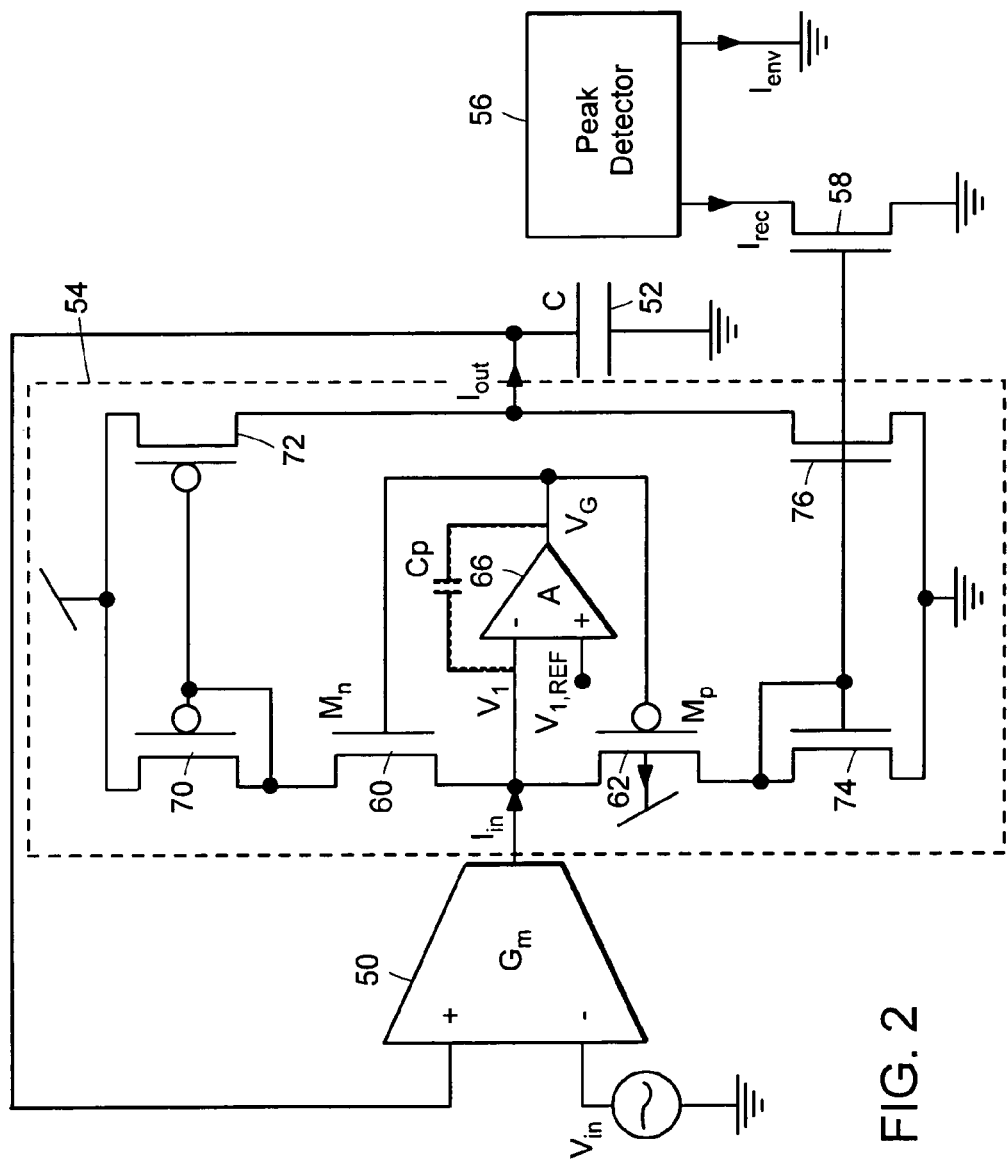
FIG. 2 shows an illustrative schematic view of an envelope detector system in accordance with an embodiment of the invention including a current conveyor with active feedback.

An envelope detector system in accordance with the first embodiment of the invention is shown in FIG. 2. The circuit includes a transconducting amplifier 50, a capacitor 52, an intervening current mirror network 54 and a peak detector circuit 56 that is coupled to the current mirror via a transistor 58. The basic current-converting rectifier topology shown is a sub-threshold Gm-C first-order high-pass filter, where the current through the capacitor 52 is split into a positive half and a negative half by the intervening current conveyor 54. The current mirror network 54 includes a pair of transistors 60 and 62, as well as a feedback amplifier 66 (A). Negative input of the amplifier 66 is coupled to the $V_I$ node, while positive input of the amplifier 66 is coupled to a reference voltage. The current conveyor 54 also includes a pair of transistors 70, 72 to mirror the negative half of the input current and a pair of transistors 74, 76 to mirror the positive half of the input current. One or both halves of the current in the rectifier output may be used depending on whether half-wave or full-wave rectification is performed.

During operation, an input voltage signal is received at the negative input of the transconducting amplifier 50, and the transconductor 50 produces a current signal $I_{in}$. On the positive half of the input current $I_{in}$ the voltage at the $V_I$ node rises slightly and the voltage at the $V_G$ node drops significantly due to the active feedback amplifier 66 (A). This turns the transistor 62 on and the transistor 60 off. Current mirror 74, 76 now mirrors this current half wave onto the output of the current conveyor 54 as well as to the output of the rectifier circuit via a transistor 58. On the negative half of the input current $I_{in}$, the voltage at the $V_I$ node drops slightly and the voltage at the $V_G$ node rises significantly due to the active feedback amplifier 66 (A). This turns the transistor 62 off and the transistor 60 on. Current mirror 70, 72 now mirrors this current half wave onto the output of the current conveyor 54. The active feedback amplifier 66 (A) drives the gates of the transistors 60 and 62 reducing the voltage swing needed at the $V_I$ node, and keeping it almost clamped. In general, the current conveyor 54 conveys the current signal $I_{in}$ to the capacitor 52 as an output current signal $I_{out}$. This current signal is integrated by the capacitor 52 and the voltage is fed back to the input of the transconductor 50 providing the first-order high-pass filter operation. The rectifier output current signal is fed into the current-mode wide-dynamic-range peak detector 56 via a transistor 58. The peak detector circuit 56 produces the envelope detector current output signal.

Figure 3:
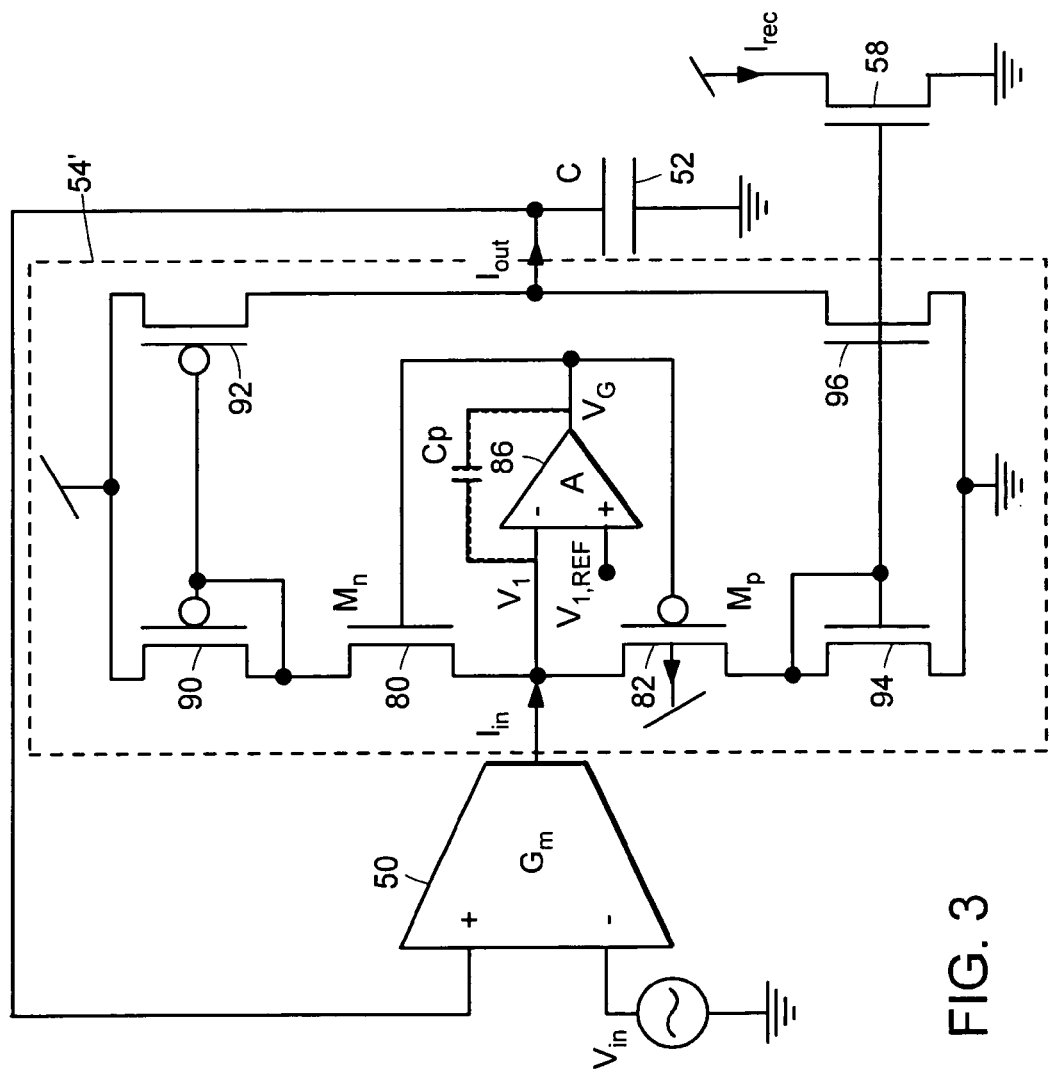
FIG. 3 shows an illustrative schematic view of a rectifier system in accordance with another embodiment of the invention including a current conveyor with active feedback.

A rectifier system in accordance with the second embodiment of the invention is shown in FIG. 3. The circuit includes a transconducting amplifier 50, a capacitor 52 and an intervening current mirror network 54'. The current mirror network 54' includes a pair of transistors 80 and 82, as well as a feedback amplifier 86 (A). Negative input of the amplifier 86 is coupled to the $V_I$ node, while positive input of the amplifier 86 is coupled to a reference voltage. The current conveyor 54' also includes a pair of transistors 90, 92 to mirror the negative half of the input current and a pair of transistors 94, 96 to mirror the positive half of the input current. One or both halves of the current in the rectifier output may be used depending on whether half-wave or full-wave rectification is performed.

During operation, an input voltage signal is received at the negative input of the transconducting amplifier 50, and the transconductor 50 produces a current signal $I_{in}$. On the positive half of the input current $I_{in}$ the voltage at the $V_I$ node rises slightly and the voltage at the $V_G$ node drops significantly due to the active feedback amplifier 86 (A): This turns the transistor 82 on and the transistor 80 off. Current mirror 94, 96 now mirrors this current half wave onto the output of the current conveyor 54' as well as to the rectifier system current output of the transistor 58. On the negative half of the input current $I_{in}$ the voltage at the $V_I$ node drops slightly and the voltage at the $V_G$ node rises significantly due to the active feedback amplifier 86 (A). This turns the transistor 82 off and the transistor 80 on. Current mirror 90, 92 now mirrors this current half wave onto the output of the current conveyor 54'. The active feedback amplifier 86 (A) drives the gates of the transistors 80 and 82 reducing the voltage swing needed at the $V_I$ node, and keeping it almost clamped. In general, the current conveyor 54' conveys the current signal $I_{in}$ to the capacitor 52 as an output current signal $I_{out}$. This current signal is integrated by the capacitor 52 and the voltage is fed back to the input of the transconductor 50 providing the first-order high-pass filter operation.

The operation of the circuits is based on the fact that provided, $I_{out}=-I_{in}$, the voltage across the capacitor is the low pass filter transfer function $V_{out}=V_{in}/(1+sC/G_m)$. The current through the capacitor is therefore $I_{out}=sC \cdot V_{in}/(1+sC/G_m)$. If the pole $$\frac{G_m}{C}$$

is chosen to be sufficiently below the lowest frequency of interest $f_{min}=100$ Hz, then $I_{out}=G_m \cdot V_{in,AC}$ independent of the input DC voltage or carrier frequency. In this implementation, the rectifier output current $I_{rec}$ is the negative half-wave corresponding to $I_{out}=-I_{in}=G_m \cdot V_{in,AC}$ with ideally zero DC offset. There is, however, one important condition: $I_{out}=-I_{in}$. Both the minimum detectable signal and an observed residual DC offset component of the $I_{rec}$ current are determined by this condition.

In certain applications, it is desirable to have $G_m$ to be constant over a wide range of input voltages. It may also be desirable to avoid very small input signals that are prone to noise and other effects. These conditions require the use of wide-linear-range transconductor techniques to implement the $G_m$ transconductor shown in FIG. 2. The transconducting amplifier 50 may be a sub-threshold wide-linear-range transconductor (such as those disclosed in "A Low-Power Wide-Linear-Range Transconductance Amplifier", by R. Sarpeshkar, R. F. Lyon, and C. A. Mead, Analog Integrated Circuits and Signal Processing, v.13, pp. 123–151, 1997), that includes a well-input differential pair transistor topology. In fact, much of the increase in the input voltage swing of the transconductor may result from using the well rather than the gate as an input in the differential pair devices. The gates of such devices are connected to their respective drains to implement gate degeneration, which further increases the input voltage swing. Transistors in the transconductor may also implement bump-linearization techniques. The combination of these techniques permits obtaining 1.7 Vpp of the input swing. A geometric scaling factor of N=5 may be implemented in the output current mirror arms of the circuit. This scaling improves power consumption, although it may possibly degrade noise performance.

The class-B current mirror networks 54 and 54' shown in FIGS. 2 and 3 respectively are capable of sourcing and sinking current from the input ($I_{in}$) and mirroring it to the output ($I_{out}$) and are examples of a class of current conveyor circuits. If no current is applied to the input node, the input devices, Mn and Mp, are both turned off. The magnitude of the gate-to-source voltages for Mn and Mp must be sufficient to obtain a source or sink current equal to the input current. The active feedback amplifier, A, drives the gates of the transistors Mn and Mp reducing the voltage swing needed at the $V_I$ node and keeping it almost clamped. Thus, a voltage dead-zone is present at the $V_G$ node such that no current is mirrored until the node voltage has changed significantly. The dead-zone is about 2.2 Vpp in the MOSIS 1.5 um process, and is comprised of the sum of the NMOS and PMOS diode drops. This dead-zone is typically not a problem for high-current systems that are able to recharge any parasitic capacitance quickly. For micropower systems, however, this dead-zone presents a power-speed tradeoff, causing the rectification to fail if $I_{in}$ is unable to recharge the parasitic capacitance $C_p$ fast enough to turn the input devices Mn and Mp on during some portion of the input cycle. The magnitude of the dead-zone is a weak logarithmic function of the input current level, but, for simplicity, we shall assume that it is almost constant.

Let us assume that $I_{in}=I_O \cdot \sin(\omega t)$ and that the dead-zone width is a constant $V_D$ peak-to-peak. The parasitic capacitance at the node $V_I$ consists of two parts: The capacitance $C_{node}$, due to the output wide linear range transconductor parasitics and node capacitance, and $C_p$, the gate-to-source parasitics of Mn and Mp. Usually $C_{node} \gg C_p$. If the amplitude $I_O$ is small enough as to be guaranteed not to turn Mn and Mp on, then $$V_1 \approx \frac{I_0}{s(C_{node} + A \cdot C_p)} \quad (1)$$

where $A \cdot C_p$ represents the Miller multiplication of source-to-gate capacitances of Mn and Mp. Then, $$V_G = A \cdot V_1 \approx \frac{I_0}{s(C_p + C_{node}/A)} \quad (2)$$

and increases as we increase $I_O$. Finally, as $V_G$ approaches $$\frac{V_D}{2},$$

the current starts to come out.

Thus, the minimum detectable $I_{in}$ current is given by $$I_{in,MIN} = \omega \cdot \left(C_p + \frac{C_{node}}{A}\right) \cdot \frac{V_D}{2} \approx \omega \cdot C_p \cdot \frac{V_D}{2} \qquad (3)$$

provided that the gain A is high enough. Since the maximum possible $I_n$ current is the effective bias current of the wide linear range transconductor, $N \cdot I_B$, we obtain a dead-zone output dynamic range limitation in currents $D_O$ given by the ratio of $N \cdot I_B$ to $I_{in,MIN}$ to be, $$D_0 \leq \frac{N \cdot I_B}{\pi \cdot f_{MAX} \cdot C_p \cdot V_D} \qquad (4)$$

Since the transconductor is just linear over this range of operation of currents, the dynamic range in input voltages is the same as the dynamic range in the output currents and also given by Equation (4). It is necessary to spend power by increasing $I_B$ if it is desirable to have a large dynamic range $D_O$ or a large frequency of operation $f_{max}$. In other words, power is necessary to get both speed and precision. Equation (4) quantifies the earlier power-speed tradeoff discussion.

It is important to have the gate-to-source capacitances that constitute $C_p$ be as small as possible to obtain a large dynamic range. This is a reason for using minimum size devices for Mn and Mp, and to connect the well of the Mp device to $V_{DD}$ rather than to its source although this increases the dead-zone $V_D$, and operate in sub-threshold as far as possible since the only contributor to the gate-to-source capacitances in sub-threshold are overlap capacitances in Mn and Mp. Tying the well of the Mp device to $V_{DD}$ increases $V_D$ somewhat, but the decrease in $C_p$ due to the exclusion of $C_{gb}$ is a far more substantial effect, especially on the low end of the dynamic range that we are interested in, where Mn and Mp are in sub-threshold, and $C_{gb}$ is the major contributor to $C_p$.

Figure 4:
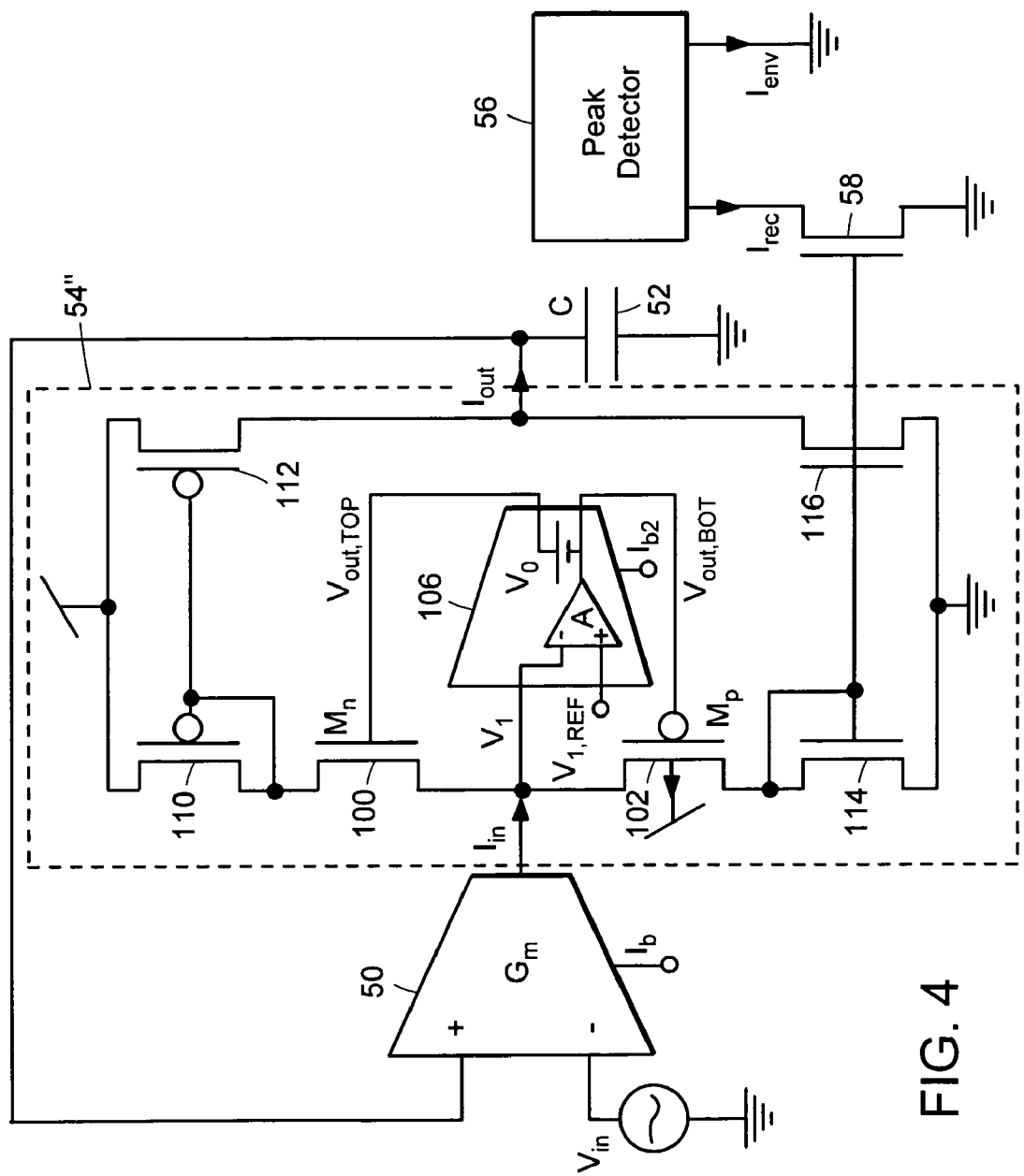
FIG. 4 shows an illustrative schematic view of an envelope detector system in accordance with another embodiment of the invention including a current conveyor with active feedback and dead-zone reduction.

A further improvement in $D_O$ is possible by reducing the dead-zone $V_D$. FIG. 4 shows the third embodiment of an envelope detection system of the invention that includes a transconducting amplifier 50, a capacitor 52, an intervening modified current mirror network 54″ and a peak detector circuit 56 that is coupled to the current mirror via a transistor 58. The modified current mirror network 54″ includes a pair of transistors 100 and 102, as well as a feedback amplifier 106 implemented as an amplifier (A) with a floating battery ($V_O$). Negative input of the amplifier 106 is coupled to the $V_I$ node, while positive input of the amplifier 106 is coupled to a reference voltage. The modified current conveyor 54″ also includes a pair of transistors 110, 112 to mirror the negative half of the input current and a pair of transistors 114, 116 to mirror the positive half of the input current. The floating battery ($V_O$) separates the gate of the transistor 100 from the gate of the transistor 102 as shown. One or both halves of the current in the rectifier output may be used depending on whether half-wave or full-wave rectification is performed.

During operation, an input voltage signal is received at the negative input of the transconducting amplifier 50, and the transconductor 50 produces a current signal $I_{in}$. On the positive half of the input current $I_{in}$ the voltage at the $V_I$ node rises slightly and the feedback amplifier 106 moves the voltage at the $V_{out,BOT}$ node low enough for the transistor 102 to sink the input current. Current mirror 114, 116 then mirrors this current half wave onto the output of the modified current conveyor 54″ as well as to the output of the rectifier circuit via a transistor 58. The voltage at the $V_{out,TOP}$ node is higher by $V_O$, and needs to go up by only $V_D$–$V_O$ to open the transistor 100 to source the input current $I_{in}$ as its sign changes. Therefore, the dead-zone is reduced to $V_D$–$V_O$. Current mirror 110, 112 then mirrors that current half wave onto the output of the modified current conveyor 54″. The feedback amplifier 106 keeps the $V_I$ node almost clamped. In general, the modified current conveyor 54″ conveys the current signal $I_{in}$ to the capacitor 52 as an output current signal $I_{out}$. This current signal is integrated by the capacitor 52 and the voltage is fed back to the input of the transconductor 50 providing the first-order high-pass filter operation. The rectifier output current signal is fed into the current-mode wide-dynamic-range peak detector 56 via a transistor 58. The peak detector circuit 56 produces the envelope detector current output signal.

Figure 5:
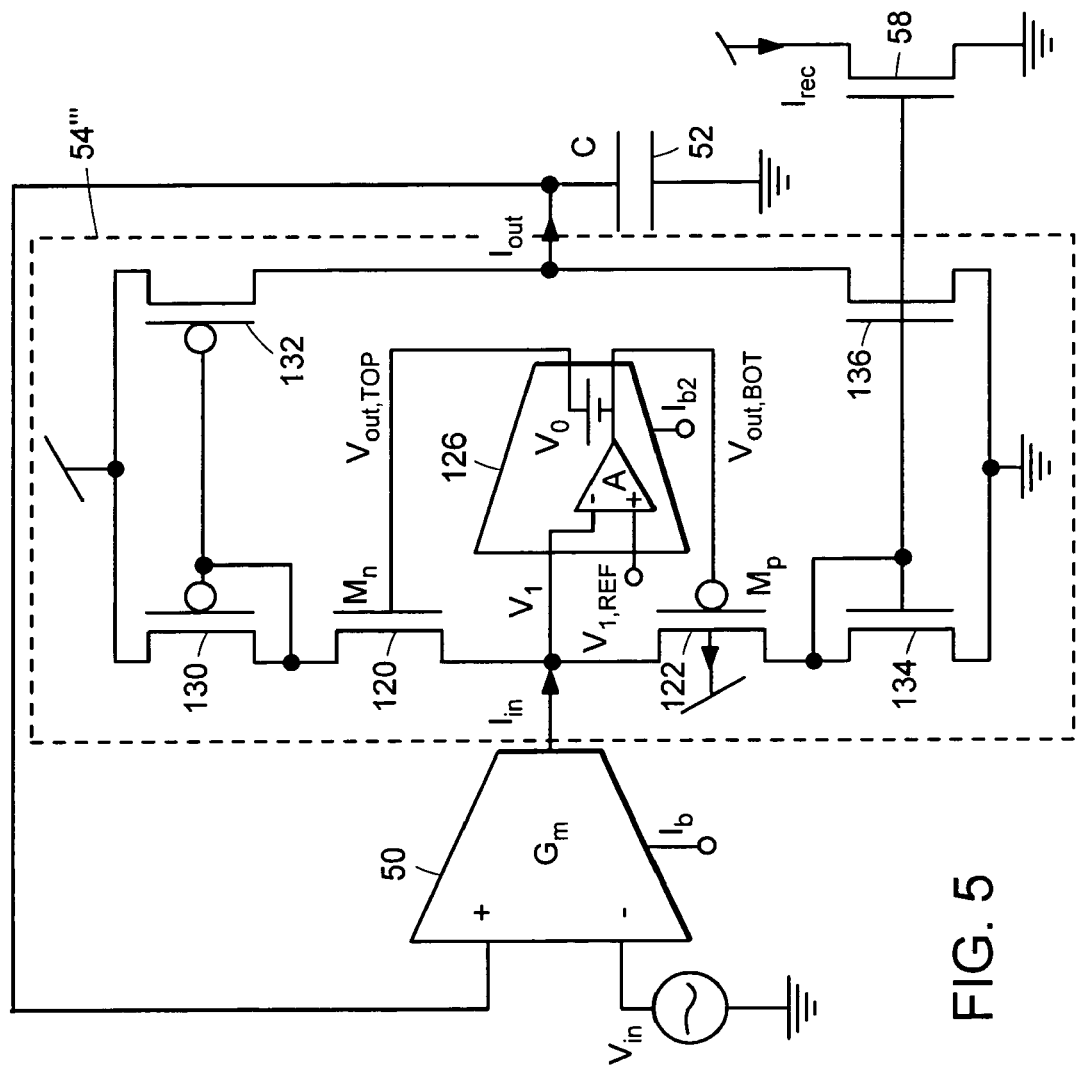
FIG. 5 shows an illustrative schematic view of a rectifier system in accordance with a further embodiment of the invention including a current conveyor with active feedback and dead-zone reduction.

A rectifier system in accordance with the forth embodiment of the invention is shown in FIG. 5. The circuit includes a transconducting amplifier 50, a capacitor 52 and an intervening modified current mirror network 54‴. The modified current mirror network 54‴ includes a pair of transistors 120 and 122, as well as a feedback amplifier 126 implemented as an amplifier (A) with a floating battery ($V_O$). Negative input of the amplifier 126 is coupled to the $V_I$ node, while positive input of the amplifier 126 is coupled to a reference voltage. The modified current conveyor 54‴ also includes a pair of transistors 130, 132 to mirror the negative half of the input current and a pair of transistors 134, 136 to mirror the positive half of the input current. The floating battery ($V_O$) separates the gate of the transistor 120 from the gate of the transistor 122 as shown. One or both halves of the current in the rectifier output may be used depending on whether half-wave or full-wave rectification is performed.

During operation, an input voltage signal is received at the negative input of the transconducting amplifier 50, and the transconductor 50 produces a current signal $I_{in}$. On the positive half of the input current $I_{in}$ the voltage at the $V_I$ node rises slightly and the feedback amplifier 126 moves the voltage at the $V_{out,BOT}$ node low enough for the transistor 122 to sink the input current. Current mirror 134, 136 then mirrors this current half wave onto the output of the modified current conveyor 54‴ as well as to the rectifier system current output of the transistor 58. The voltage at the $V_{out,TOP}$ node is higher by $V_O$, and needs to go up by only $V_D$–$V_O$ to open the transistor 120 to source the input current $I_{in}$ as its sign changes. Therefore, the dead-zone is reduced to $V_D$–$V_O$. Current mirror 130, 132 then mirrors that current half wave onto the output of the modified current conveyor 54‴. The feedback amplifier 126 keeps the $V_I$ node almost clamped. In general, the modified current conveyor 54‴ conveys the current signal $I_{in}$ to the capacitor 52 as an output current signal $I_{out}$. This current signal is integrated by the capacitor 52 and the voltage is fed back to the input of the transconductor 50 providing the first-order high-pass filter operation.

The desired dead-zone reduction, therefore, may be accomplished by introducing a constant DC voltage shift $V_O$ between the gates of the Mn and Mp rectifying devices. The dead-zone is reduced to $V_D$–$V_O$. This dead-zone reduction technique is limited however because of an upper bound on $V_O$. From applying the translinear principle, it follows that this technique will result in an output offset current—even with no $I_{in}$ current present, $V_{out,BOT}$ and $V_{out,TOP}$ gate voltages will be set by the A amplifier such that the Mn and Mp standby currents (zero-input currents) are equal. These standby currents have an exponential dependence on $V_O$ and are mirrored directly to the output of the rectifier stage. This zero-input offset current should be no more than a few pA, thus setting a ceiling on $V_O$ of approximately 1.55 V in the MOSIS 1.5 um process for minimum size Mn and Mp. It is possible to have dummy devices and subtract some of these standby currents, but as discussed below, having a large $V_O$ where such subtraction would be beneficial is undesirable because of thermal noise rectification. The class AB $V_O$ technique yields a dead-zone reduction from 2.2 Vpp to 0.65 Vpp—an improvement of a factor of 3, or 10 dB in $D_O$.

Figure 6:
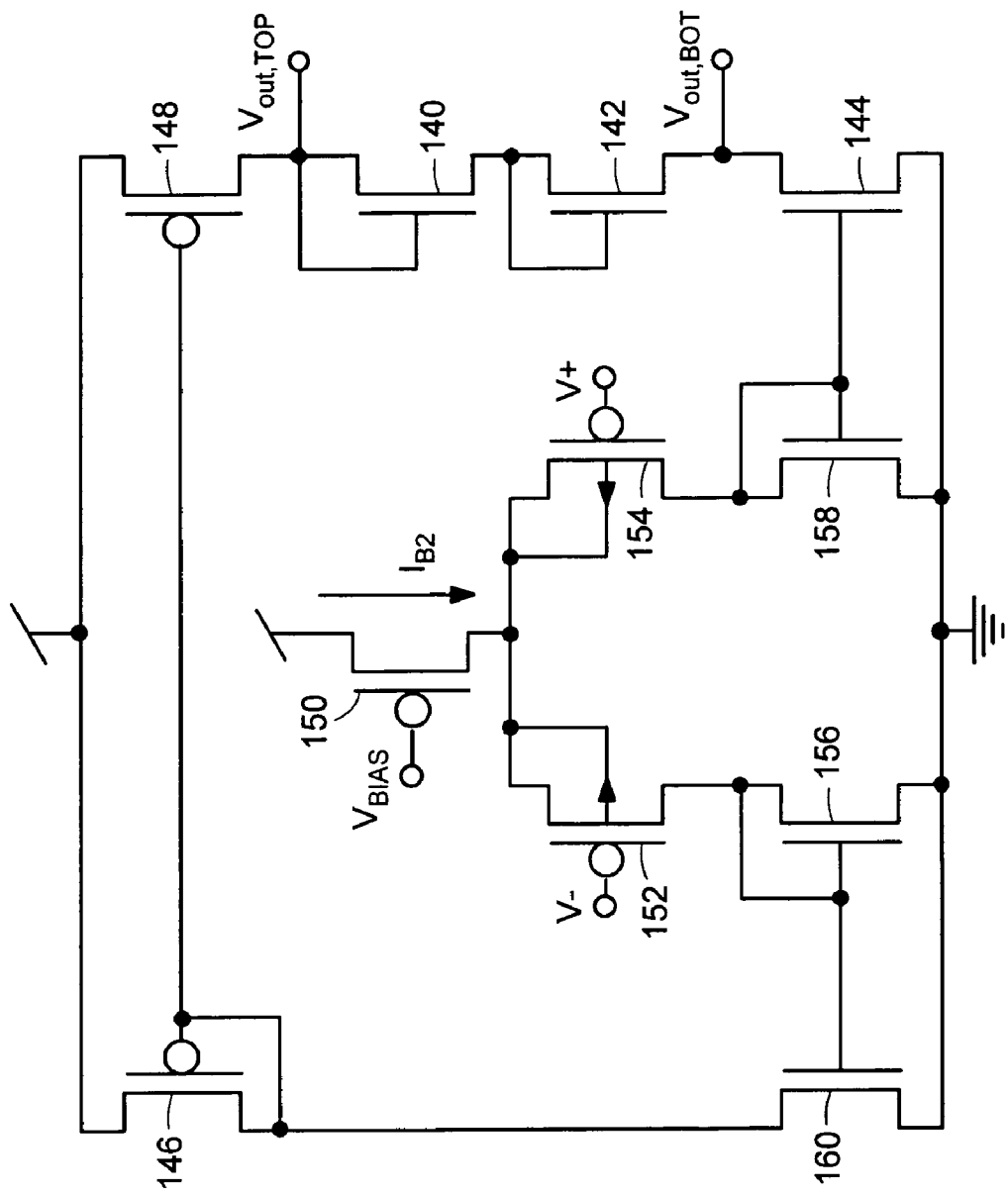
FIG. 6 shows an illustrative schematic view of an active feedback amplifier with a floating battery implementation for the dead-zone reduction for use with a system in accordance with an embodiment of the invention.

FIG. 6 shows an implementation of an amplifier with a floating battery $V_O$ in accordance with an embodiment of the invention. The value of $V_O$ may be adjusted to some degree by changing the bias current $I_{B2}$ of the amplifier. As shown in FIG. 6, an amplifier includes negative and positive input nodes V− and V+ respectively for receiving an input voltage signal. The input voltage signal is received by a differential pair of transistors 152, 154 that is biased by a current $I_{B2}$ supplied by a transistor 150. The amplifier also includes a voltage bias node $V_{BIAS}$ for changing the bias current $I_{B2}$ of the differential pair 152, 154. Transistor 152 is coupled to the output node $V_{out,TOP}$ via current mirrors 156, 160 and 146, 148. Transistor 154 is coupled to the output node $V_{out,BOT}$ via current mirror 158, 144. The output nodes $V_{out,TOP}$ and $V_{out,BOT}$ are separated by one or more diode connected transistors (140, 142).

During operation of the circuit of FIG. 6, the difference in the voltages on the input nodes V+ and V− creates the difference in currents flowing through the transistors 152 and 154. This difference in currents is mirrored by the current mirrors 156, 160 and 146, 148 and the current mirror 158, 144 to the output nodes $V_{out,TOP}$ and $V_{out,BOT}$ of the transconducting amplifier. Since the transconducting amplifier drives the gates of the minimum size devices in accordance with an embodiment of the invention, it behaves like a voltage amplifier, i.e. the difference in currents translates into the voltage swing on the output nodes $V_{out,TOP}$ and $V_{out,BOT}$. If the voltages on the input nodes V+ and V− are equal, the bias current $I_{B2}$ will be equally split between the transistors 152, 154 of the differential pair, and mirrored by the current mirrors 156, 160 and 146, 148 and the current mirror 158, 144. Thus, the amplifier effectively rejects the common mode voltage and effectively amplifies the differential voltage on the input nodes V+ and V−, providing an almost constant current equal to $I_{B2}/2$ through one or more diode connected transistors 140, 142. That creates an almost constant voltage drop $V_O$ across one or more diode connected transistors 140, 142 that can be controlled to some degree by the amplifier bias current $I_{B2}$. In accordance with an embodiment of the invention, the amplifier of FIG. 6 is a part of a non-linear feedback loop of the nature that eliminates the adverse effects of the component mismatches in the circuit or AC components in a floating battery voltage $V_O$.

The noise of the wide linear range transconductor also results in another limitation on the system dynamic range. For certain device sizes and currents the effect of 1/f noise in the circuit is negligible in sub-threshold operation. The thermal noise current at the wide linear range transconductor output, however, is fed to the current conveyor, rectified by it, and mirrored to the output, creating a residual output current floor that degrades the minimum detectable signal and dynamic range of the system. The current power spectral density of the white noise at the wide linear range transconductor output is $$\overline{i_{noise}}^2 (f) = n \cdot q \cdot NI_B, \quad (5)$$

where, $$n = \left(\frac{2 \cdot \kappa_n}{\kappa_p + \kappa_n}\right) \cdot N + 2N + 2 \approx 2.68N + 2 \quad (6)$$

represents the effective number of noise sources in our wide linear range transconductor, $\kappa_n$ is the sub-threshold exponential parameter of the NMOS transistors in the current mirror of the wide linear range transconductor, and $\kappa$ is the sub-threshold exponential parameter of the differential-pair PMOS transistors.

From the above discussion about the dead-zone limitation, it is clear that the higher the frequency of the input current, the higher the threshold presented by the dead-zone $$I_{in,MIN} = \pi f \cdot C_p \cdot (V_D - V_O) \quad (7)$$

Almost all of the low-frequency part of the white noise spectrum passes to the output, whereas the high-frequency part gets filtered out by the capacitor $C_p$. For simplicity, assume that the dead-zone and $C_p$ create a low-pass filter with an infinitely steep slope at a still-to-be-determined cut-off frequency $f_o$. With this assumption, our current conveyor behaves as if the $I_{in}$ current were Gaussian with zero mean and $$\sigma^2 = n \cdot q \cdot NI_B \cdot f_o \quad (8)$$

Then, $$\overline{I}_{rec} = \int_0^{+\infty} I \cdot \frac{1}{\sqrt{2\pi} \cdot \sigma} e^{\frac{I^2}{2\sigma^2}} \cdot dI = \frac{\sigma}{\sqrt{2\pi}} = \sqrt{\frac{n \cdot q \cdot NI_B \cdot f_0}{2\pi}} \quad (9)$$

To estimate the cut-off frequency $f_O$ note that once the frequency-dependent threshold presented by the dead-zone in Equation (7) gets higher than the σ of Equation (8), little current is output by the rectifier. A reasonable estimate therefore, is to assume that the frequency-dependent threshold at $f_o$ is at σ. Thus, $$\pi \cdot f_0 \cdot C_p \cdot (V_D - V_0) \cong \sqrt{n \cdot q \cdot NI_B \cdot f_0} \Rightarrow \sqrt{f_0} \cong \frac{\sqrt{n \cdot q \cdot NI_B}}{\pi \cdot C_p \cdot (V_D - V_0)} \quad (10)$$

Providing the result for $f_o$ back into Equation (9):

$$\overline{I}_{rec} \cong \frac{n \cdot q \cdot NI_B}{\pi \sqrt{2\pi} \cdot C_p \cdot (V_D - V_0)} \quad (11)$$

Recalling Equation (4) for the dead-zone dynamic range limitation provides:

$$\bar{I}_{rec} \cong \frac{n \cdot q \cdot f_{MAX} \cdot D_0}{\sqrt{2\pi}} \quad (12)$$

In accordance with the embodiment of the invention of FIG. 4 and FIG. 5, $N=5 \Rightarrow n \approx 15.4, q=1.6 \cdot 10^{-19} C, D_O$ was designed and simulated to be 80 dB=$10^4$ for $f_{MAX}$=10 kHz, $I_B$=200 nA (bias current through wide linear range transconductor 50), and $I_{b2}$=200 nA (bias current A amplifier yielding $V_O$=1.55 V and a deadzone of 0.65 V pp). This provides that $\bar{I}_{rec}$=100 pA. The corresponding experimentally measured result is $\bar{I}_{rec}$=119 pA, indicating that the above approximations and assumptions are sound.

The larger one makes $D_O$ to increase the minimum detectable signal limited by the dead-zone non-linearity, the higher the rectified-noise-current floor becomes, and the greater is the degradation in minimum detectable signal caused by this current floor. Since the overall dynamic range of the system is determined by whichever effect yields a larger minimum detectable signal (dead-zone limitation or noise-rectification), the maximum dynamic range is achieved if both effects yield the same limit. At this optimum, as much power as necessary is being spent to achieve the highest $D_O$ possible but not so much power is being spent that the rectification-noise-floor increases and limits the dynamic range to values below $D_O$.

Alternatively, at a fixed power level, if the dead-zone and noise-rectification limits match, the dead-zone is at a small enough value such that it may be overcome with faint amplified signals but not too small of signals that the rectified-noise-current floor swamps the output current due to the faint signals. Thus, the optimum dynamic range is achieved when the limit of minimum detectable signal due to the rectified-noise-current floor of Equation (11) becomes equal to the mean value of the dead-zone minimum detectable current. The dead-zone minimum detectable current is a half-wave rectified sinusoid with an amplitude given by Equation (7). A half-wave-rectified sine wave has a mean current that is $1/\pi$ of its amplitude. Referring to Equations (11) and (7) it may be discovered that $$\frac{n \cdot q \cdot NI_B}{\pi\sqrt{2\pi} \cdot C_p \cdot (V_D - V_0)} = \frac{\pi \cdot f_{MAX} \cdot C_p \cdot (V_D - V_0)}{\pi} \quad (13)$$

Algebraic simplification yields $$[C_p \cdot (V_D - V_0)]_{optimum} = \sqrt{\frac{n \cdot q \cdot NI_B}{\pi\sqrt{2\pi} \cdot f_{MAX}}} \quad (14)$$

Substituting this result back into Equation (4) provides $$D_{optimum} = \sqrt[4]{\frac{2}{\pi}} \cdot \sqrt{\frac{NI_B}{n \cdot q \cdot f_{MAX}}} \quad (15)$$

The optimal dynamic range therefore depends on topological parameters only such as n and N, the charge on the electron q, and is independent of technological parameters like $C_p$ and $V_D$. To achieve more dynamic range at a given $f_{MAX}$ and in a given technology, more power must be spent according to Equation (15), and simultaneously decrease $V_O$ in Equation (14) to ensure that the optimum location is provided. Intuitively, one burns power to allow smaller and smaller signals to break the dead-zone but concomitantly increase the dead-zone such that the noise-rectification limit always matches the dead-zone limit.

Due to the power constraints, only $I_B$=200 nA may be afforded in the present embodiment. According to Equation (15), that gives us a maximum possible system dynamic range of $D_{optimum} \approx 75$ dB. In order to reach this optimum $V_O$ is decreased, and the dead-zone is increased, by turning down the bias current $I_{b2}$ of the A amplifier.

Figure 7:
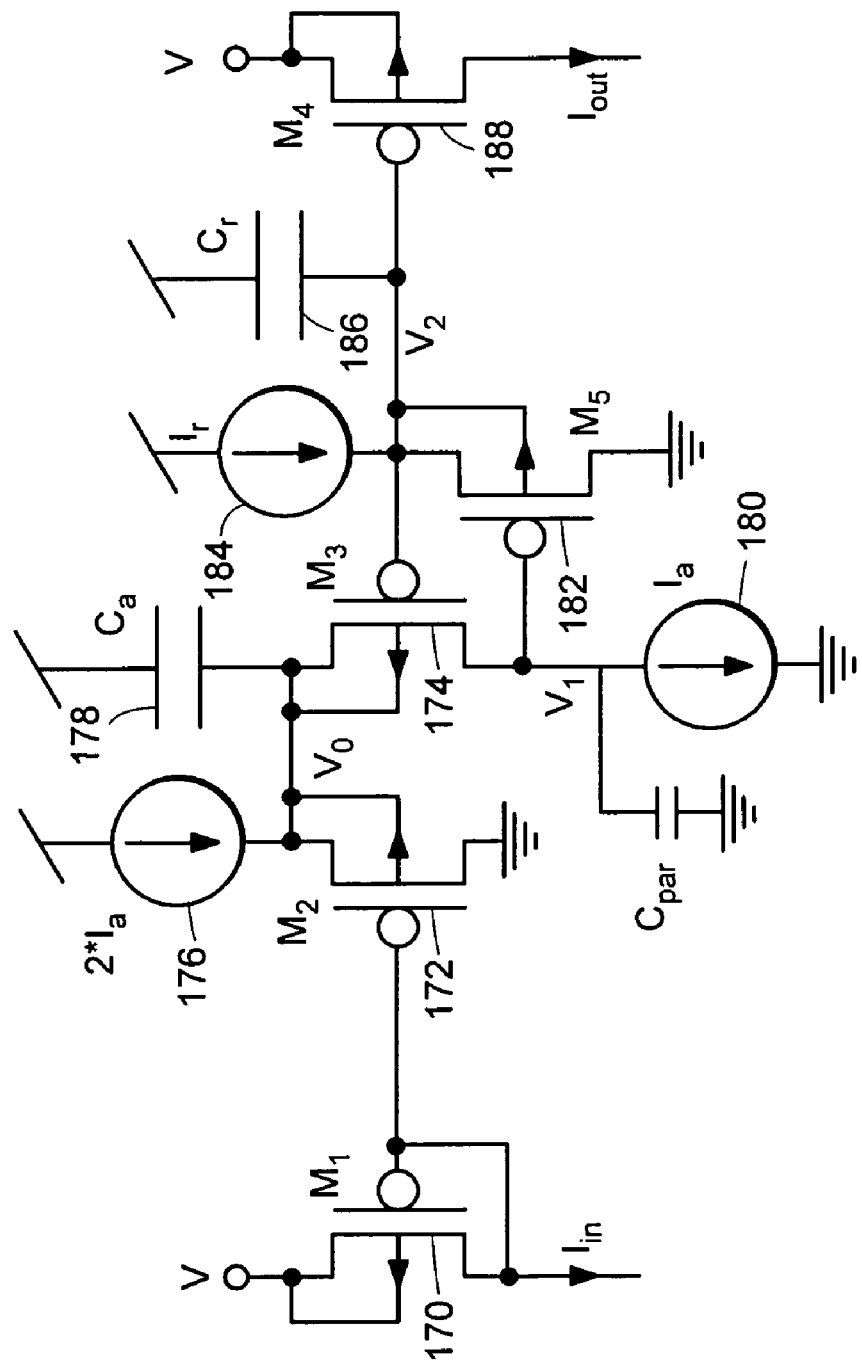
FIG. 7 shows an illustrative diagrammatic view of a wide dynamic range current-mode peak detector system in accordance with an embodiment of the invention involving adjustable attack and release time constants.

FIG. 7 shows a current-mode peak detector system in accordance with an embodiment of the invention with wide-dynamic-range nanopower operation and adjustable attack and release time constants. As shown, the circuit include a current input transistor 170, a log-domain low-pass filtering transistor 172 coupled to a current source 176 and a capacitor 178 (Ca), a feedback loop on transistors 174, 182 coupled to a second current source 180 with a parasitic capacitance Cpar, a third current source 184 and a capacitor 186 (Cr), and a current output transistor 188.

During operation of the circuit of FIG. 7, transistor 170 receives an input current and converts it into voltage supplied to the transistor 172. The current through the transistor 174 is always approximately equal to the current of the current source 180, $I_a$, provided that the parasitic capacitance $C_{par}$ of the node $V_1$ is small. Therefore, the source voltage of the transistor 172, $V_O$, is proportional to a logarithm of the low-pass-filtered input current with a time constant (such as disclosed in "Log-Domain Filtering: An Approach to Current-Mode Filtering", by D. R. Frey, IEEE Proceedings, Part G, vol. 140, pp. 406–416, 1993) given by $$\tau_a = \frac{C_a \cdot \phi_t}{\kappa \cdot I_a} \quad (16)$$

where $$\phi_t \equiv \frac{k \cdot T}{q} \approx 25 \text{ mV},$$

and κ is the subthreshold slope coefficient.

As the input current $I_{in}$ increases during an attack phase, the $V_O$ voltage decreases. This decrease causes the drain current of the transistor 174 to decrease. The current $I_a$ from the current source 180 then quickly discharges parasitic capacitance $C_{par}$ decreasing $V_1$. The decrease in $V_1$ causes transistor 182 to open and to quickly decrease the voltage on the node $V_2$, thus restoring the drain current of the transistor 174. Therefore, the transistor 174 behaves like a voltage shifter during the attack phase of the input current $I_{in}$. Transistor 188 then converts the voltage on the node $V_2$ into an output current of the peak detector system. Peak detector adjustable attack time constant is therefore given by Equation (16). As the input current $I_{in}$ decreases during a release phase, the $V_O$ voltage goes up. This causes the drain current of the transistor 174 to increase, increasing the $V_1$ voltage sharply, which turns off transistor 182 and restores the drain current of the transistor 174. Now, the voltage on the node $V_2$ changes only due to charging of the capacitor 186 ($C_r$) by the current from the current source 184 ($I_r$). Transistor 188 then converts the voltage on the node $V_2$ into an output current of the peak detector system. Peak detector adjustable release time constant is given by $$\tau_r = \frac{C_r \cdot \phi_t}{\kappa \cdot I_r} \quad (17)$$

The feedback loop formed by M5 and M3 is similar to the one in the simple peak-detector topology (such as disclosed in "A Low-Power Wide-Dynamic Range Analog VLSI Cochlea", by R. Sarpeshkar, R. F. Lyon, and C. A. Mead, Analog Integrated Circuits and Signal Processing, v.16, pp. 245–274, 1998). To provide good phase margin, the current $I_a$ has to satisfy $$I_a > I_r \cdot \frac{C_{par}}{C_r} \cdot A_3^2 \quad (18)$$

where $$A_3 \equiv \frac{g_{m3}}{g_{ds3}}.$$

Unlike in the simple peak-detector topology (such as disclosed in "A Low-Power Wide-Dynamic Range Analog VLSI Cochlea", by R. Sarpeshkar, R. F. Lyon, and C. A. Mead, Analog Integrated Circuits and Signal Processing, v.16, pp. 245–274, 1998), the good-phase-margin conditions do not affect the dynamic range of operation, because all currents in the M3–M5 feedback loop are fixed.

The peak-detector topology of FIG. 7 does experience a slight dependence of its output current on frequency: The ripple at the $V_O$ node after attack filtering is larger for low carrier frequencies than for high frequencies. Consequently, the following release filter will follow the peaks of the ripple around the frequency-independent $V_O$ mean, and cause a slight rise in the output current for low frequencies.

Figure 8:
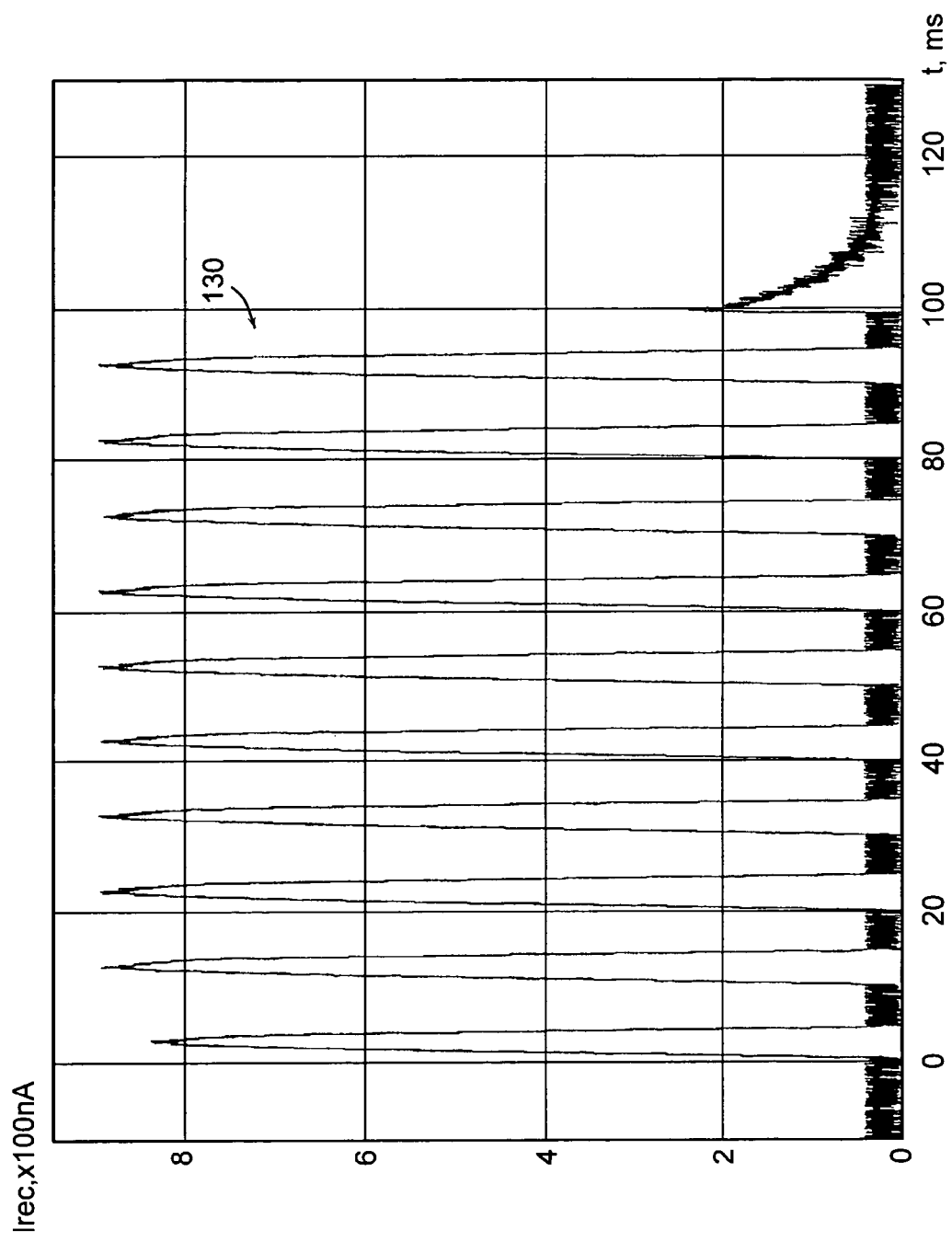
FIG. 8 shows an illustrative diagrammatic graphical representation of an experimental rectifier output current waveform for a system in accordance with an embodiment of the invention.
Figure 9:
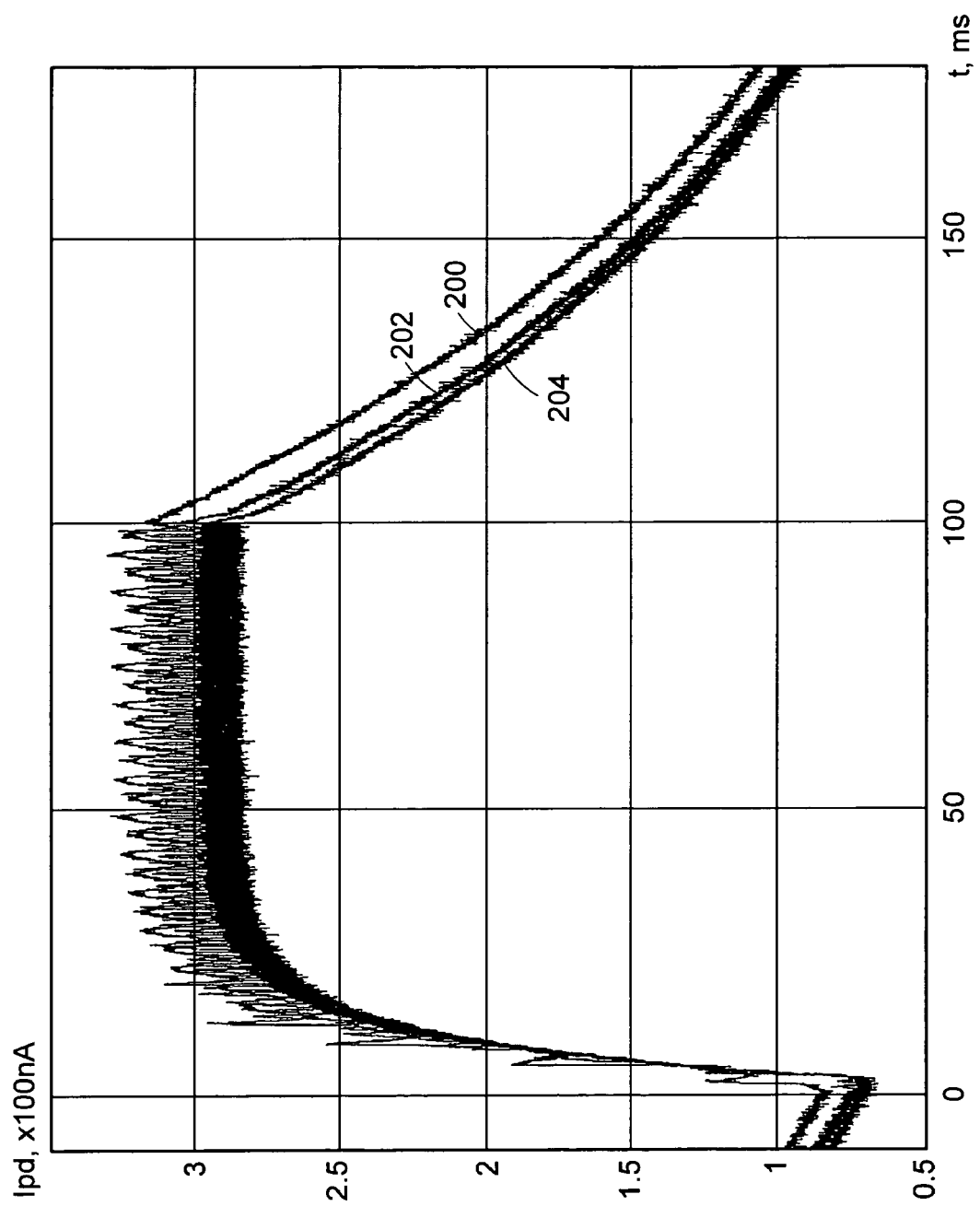
FIG. 9 shows an illustrative diagrammatic graphical representation of experimental peak detector output current waveforms for a system in accordance with an embodiment of the invention for frequencies of 100 Hz, 1 kHz and 10 kHz where the attack time constant is about 10 ms and the release time constant is about 100 ms.

An integrated circuit chip with this envelope detector may be fabricated using a 1.5 um CMOS process. FIG. 8 shows experimental waveforms of the rectifier output current at $f=100$ Hz for a tone-burst input. The half-wave rectification is evident as shown at 190. FIG. 9 shows experimental waveforms of the envelope-detector output current for three tone-burst carrier frequencies of 300 Hz, 1 kHz, and 10 kHz at 200, 202 and 204 with the same input signal amplitude. The attack time constant is approximately 10 ms, and the release time constant is approximately 100 ms. Both these time constants may be adjusted by altering $I_a$ and $I_r$ in FIG. 7. More ripple is observed for low-frequency inputs than high-frequency inputs and a weak dependence of the output current as well.

FIG. 10 shows experimentally measured envelope detector characteristics at 100 Hz, 1 kHz, and 10 kHz at 210, 212 and 214 respectively for input signal amplitudes ranging over the entire 75 dB of operation. The plot saturates at $V_{in} \approx 1.7$ Vpp on the high end of the dynamic range, and flattens out at approximately $V_{in}$ 300 µVpp on the low end, revealing that the envelope detector provides proportional and linear information about the input signal envelope over a dynamic range of 75 dB at all audio frequencies of interest.

The saturation is caused by the wide linear range transconductor moving out of its linear range while the flattening is due to the thermal-noise-rectified output current floor discussed above.

FIG. 11 shows experimentally measured envelope detector characteristics at 10 kHz for various $I_{b2}$, i.e., various deadzone widths. In particular, the envelope detector characteristics for $I_{b2}$ of 2 nA, 5 nA, 10 nA, 25 nA, 50 nA and 200 nA are shown at 220, 222, 224, 226, 228 and 230 respectively. At low values of $I_{b2}$, the deadzone is wide, so both the dead-zone-limited dynamic range and the rectified-noise current floor are low. By increasing $I_{b2}$ the dead-zone width may be decreased, improving the dead-zone-limited dynamic range, but also increasing the rectified-noise current floor. At the optimal point ($I_{b2}=25$ nA) the dead-zone minimum detectable signal equals the rectified-noise current floor, and we obtain 75 dB of dynamic range, in excellent agreement with the theory discussed above. Further increases in, $I_{b2}$, i.e., reductions in dead-zone width, lead to improvement of the dead-zone minimum detectable signal, but degrade the rectified-noise current floor, degrading overall dynamic range of the system. FIG. 12 illustrates this point further, showing the overall dynamic range of the system vs. $I_{b2}$ for 2 nA, 5 nA, 10 nA, 25 nA, 50 nA, 100 nA and 200 nA are shown at 240, 242, 244, 246, 248, 250 and 252 respectively.

The combination of a wide-linear-range transconductor topology, a modified current conveyor, and a novel current-mode peak-detector yielded a 75 dB 2.8 µ W envelope detector with frequency-independent operation over the entire audio range from 100 Hz to 10 kHz. The current-mode peak detector provided wide-dynamic-range good-phase-margin operation with adjustable attack and release time constants. Theoretical predictions of the minimum detectable signal of the envelope detector due to dead-zone-limiting effects and thermal-noise-rectification effects may be confirmed experimentally. Maximum possible dynamic range predicted from theory may also be achieved. The detector should be useful in ultra low power bionic implants for the deaf, hearing aids, and low-power speech-recognition front ends where automatic gain control and spectral-energy computations require the use of envelope detection. The topology of the detector could also potentially be useful in higher-frequency applications like sonar or RF-demodulation if more power is consumed.

Those skilled in the art will appreciate that numerous modifications and variations may be made to the above disclosed embodiments without departing from the spirit and scope of the invention.

What is claimed is:

1. An envelope detector system for detecting an envelope in a system input signal, said envelope detector system comprising:
    an input node for receiving an input voltage signal;
    a transconducting amplifier for receiving said input voltage signal and producing an input current signal;
    a current mirror network for receiving said input current signal and for producing a current output signal, said current mirror network including a feedback amplifier;
    a capacitor for receiving said current output signal, said capacitor being coupled to an input of said transconducting amplifier; and
    a rectifier output node for providing a current rectifier signal.

2. The envelope detector system as claimed in claim 1, wherein said system further includes a peak detector circuit that is coupled to said rectifier output node.

3. The envelope detector system as claimed in claim 1, wherein said transconducting amplifier includes a wide linear range transconductor.

4. The envelope detector system as claimed in claim 1, wherein said current mirror network includes a DC voltage shift circuit for a class AB biasing.

5. The envelope detector system as claimed in claim 1, wherein said current mirror network provides an output offset current due to said class AB biasing.

6. The envelope detector system as claimed in claim 1, wherein said current mirror network provides an additional output offset current due to the rectification of the thermal noise current from said transconducting amplifier.

7. The envelope detector system as claimed in claim 1, wherein said capacitor is being coupled to an input of said transconducting amplifier, provides a DC negative feedback ensuring high-pass filter characteristics of said system.

8. A rectifier system for rectifying an envelope in a system input signal, said rectifier system comprising:
   an input node for receiving an input voltage signal;
   a transconducting amplifier for receiving said input voltage signal and producing an input current signal;
   a current mirror network for receiving said input current signal and for producing a current output signal, said current mirror network including a feedback amplifier; and
   a capacitor for receiving said current output signal, said capacitor being coupled to an input of said transconducting amplifier.

9. The rectifier system as claimed in claim 8, wherein said transconducting amplifier includes a wide linear range transconductor.

10. The rectifier system as claimed in claim 8, wherein said current mirror network includes a DC voltage shift circuit for a class AB biasing.

11. The rectifier system as claimed in claim 8, wherein said current mirror network provides an output offset current due to said class AB biasing.

12. The rectifier system as claimed in claim 8, wherein said current mirror network provides an additional output offset current due to the rectification of the thermal noise current from said transconducting amplifier.

13. The rectifier system as claimed in claim 8, wherein said capacitor is being coupled to an input of said transconducting amplifier, provides a DC negative feedback ensuring high-pass filter characteristics of said system.

14. A peak detector system for extracting an envelope from the rectified current input signal of the system, said peak detector system comprising:
   an input node for receiving an input current signal;
   a circuit for receiving said input current signal and producing an input voltage signal;
   a translinear low-pass-filtering circuit for receiving said input voltage signal and for producing a voltage proportional to a logarithm of low-pass filtered said input current signal;
   a non-linear one-directional feedback circuit for receiving said voltage and for producing an output voltage signal depending on the direction of change in said voltage;
   a circuit for receiving said output voltage signal and producing an output current signal; and
   a peak detector output node for providing an output current peak detector signal.

15. The peak detector system as claimed in claim 14, wherein said translinear low-pass-filtering circuit includes a transistor that is coupled to a current source and a capacitor for setting an attack time constant.

16. The peak detector system as claimed in claim 14, wherein said non-linear one-directional feedback circuit includes two transistors that are coupled to two current sources and a capacitor for setting a release time constant.

17. An envelope detector system for detecting an envelope in a system input signal, said envelope detector system comprising:
   an input node for receiving an input voltage signal;
   a transconducting amplifier for receiving said input voltage signal and producing an input current signal;
   a current mirror network for receiving said input current signal and for producing a current output signal, said current mirror network including a D C voltage shift circuit for a class AB biasing;
   a capacitor for receiving said current output signal, said capacitor being coupled to an input of said transconducting amplifier; and
   a rectifier output node for providing a current rectifier signal.

18. The envelope detector system as claimed in claim 17, wherein said system further includes a peak detector circuit that is coupled to said rectifier output node.

19. The envelope detector system as claimed in claim 17, wherein said transconducting amplifier includes a wide linear range transconductor.

20. The envelope detector system as claimed in claim 17, wherein said current mirror network includes a feedback amplifier.

21. The envelope detector system as claimed in claim 17, wherein said current mirror network provides an output offset current due to said class AB biasing.

22. The envelope detector system as claimed in claim 17, wherein said current mirror network provides an additional output offset current due to the rectification of the thermal noise current from said transconducting amplifier.

23. The envelope detector system as claimed in claim 17, wherein said capacitor is being coupled to an input of said transconducting amplifier, provides a DC negative feedback ensuring high-pass filter characteristics of said system.

24. A rectifier system for rectifying an envelope in a system input signal, said rectifier system comprising:
   an input node for receiving an input voltage signal;
   a transconducting amplifier for receiving said input voltage signal and producing an input current signal;
   a current mirror network for receiving said input current signal and for producing a current output signal, said current mirror network including a DC voltage shift circuit for a class AB biasing; and
   a capacitor for receiving said current output signal, said capacitor being coupled to an input of said transconducting amplifier.

25. The rectifier system as claimed in claim 24, wherein said transconducting amplifier includes a wide linear range transconductor.

26. The rectifier system as claimed in claim 24, wherein said current mirror network includes a feedback amplifier.

27. The rectifier system as claimed in claim 24, wherein said current mirror network provides an output offset current due to said class AB biasing.

28. The rectifier system as claimed in claim 24, wherein said current mirror network provides an additional output offset current due to the rectification of the thermal noise current from said transconducting amplifier.

29. The rectifier system as claimed in claim 24, wherein said capacitor is being coupled to an input of said transconducting amplifier, provides a DC negative feedback ensuring high-pass filter characteristics of said system.

* * * * *